United States Patent [19]

Yahalom

[11] Patent Number: 5,096,791

[45] Date of Patent: Mar. 17, 1992

[54] METHOD FOR PREPARATION OF MASK FOR X-RAY LITHOGRAPHY

[75] Inventor: Joseph Yahalom, Haifa, Israel

[73] Assignee: Technion Research and Development Foundation, Ltd., Haifa, Israel

[21] Appl. No.: 442,868

[22] Filed: Nov. 29, 1989

Related U.S. Application Data

[63] Continuation-in-part of Ser. No. 357,934, May 26, 1989, abandoned, and a continuation-in-part of Ser. No. 378,940, Jul. 12, 1989, abandoned.

[30] Foreign Application Priority Data

Dec. 30, 1988 [IL] Israel ............................. 088837

[51] Int. Cl.$^5$ .................................. G03F 9/00
[52] U.S. Cl. ........................... 430/5; 430/967; 378/35
[58] Field of Search ............... 430/5, 967; 378/35

[56] References Cited

U.S. PATENT DOCUMENTS

| | | | |
|---|---|---|---|
| 3,742,230 | 6/1973 | Spears et al. | 378/35 |
| 4,101,782 | 1/1983 | Seliger | 430/319 |
| 4,368,215 | 1/1983 | Seliger | 427/38 |
| 4,451,544 | 5/1984 | Kawabuchi | 430/5 |
| 4,604,292 | 8/1986 | Evans et al. | 430/967 |
| 4,634,643 | 1/1987 | Suzuki | 430/5 |
| 4,771,017 | 9/1988 | Tobin et al. | 437/184 |

FOREIGN PATENT DOCUMENTS

| | | | |
|---|---|---|---|
| 85170 | 7/1978 | Japan | 430/5 |
| 14837 | 1/1983 | Japan | 430/5 |

OTHER PUBLICATIONS

Bassous et al., "High Transmission X-Ray Mask for Lithographic Applications", *Solid State Tech.*, Sep. 1976, pp. 55-58.

Determination of Wavelength and Excitation Voltage for X-Ray Lithography Paul A. Sullivan and John H. McCoy, *IEEE Transactions on Electron Devices*, vol. Ed-23, No. 4, Apr. 1976.

Abstract: New X-Ray Mask of Al-Al$_2$O$_3$ Structure, T. Funayama, Y. Takayama T. Inagaki and M. Nakamura, *J. Vac. Sci. Technol.*, vol. 12, No. 6, Nov./Dec. 1975.

Primary Examiner—Charles L. Bowers, Jr.
Assistant Examiner—Thomas R. Neville
Attorney, Agent, or Firm—Browdy and Neimark

[57] ABSTRACT

A method of obtaining a mask for X-ray lithography having a thin oxidized metal membrane supported on an annular silicon base. The method consists of the following steps: (a) deposition of a metal layer on a silicon wafer; (b) oxidation of the metal layer to form a continuous thin oxide layer; (c) etching selectively a portion of the backside of said substrate, obtaining a thin membrane of oxidized metal at the etched portion; and (d) obtaining a pattern delineation through a photoresist on said membrane framed by the silicon substrate. A most preferred deposited metal is aluminum which is converted to aluminum oxide. Then a portion of the silicon substrate is removed in order to expose the aluminum oxide membrane attached to the remaining silicon substrate. The mask prepared according to the present invention does not suffer from any distortion and preserves its accuracy even under the stresses incurred during the mask preparation and use.

31 Claims, 1 Drawing Sheet

Si

SiO₂

ETCH

Aℓ

WAX

Aℓ₂O₃

Aℓ₂O₃

Aℓ₂O₃

METHOD FOR PREPARATION OF MASK FOR X-RAY LITHOGRAPHY

CROSS-REFERENCE TO RELATED APPLICATIONS

This application is a continuation-in-part of co-pending application Ser. No. 357,934 filed May 26, 1989, now abandoned, and a continuation-in-part of copending application Ser. No. 378,940 filed July 12, 1989, now abandoned.

FIELD OF THE INVENTION

The present invention relates to X-ray lithography. More particularly, the invention relates to a new method for obtaining a mask for X-ray lithography.

BACKGROUND OF THE INVENTION

Lithography is recognized as one of the most widely used methods of printing. In its usual commercial or industrial application it is known as offset lithography because the inked image is first printed on a rubber cylinder, which then offsets or transfers the image to paper or other material. In lithography, the matter to be printed is neither raised above nor sunk below the surface of the plate but remains on the surface, or plane.

X-ray lithography, developed in the last twenty years, has become an important aid to the art of lithography. X-ray lithography is now considered to be an effective method for pattern replication down to the submicron range, required by the huge development of the technology for the production of microelectronic circuits. In this technique, by a beam of ¡X-rays of low angular divergence, a shadow image of the mask pattern is projected onto the wafer which is cpated with an X-ray sensitive resist. Accordingly, high demands must be made on the masks concerning the dimensional stability and accuracy of the absorber pattern since submicron structures must be transferred.

The literature is quite abundant with various patents and reviews concerning the manufacture of masks to be useful for X-ray lithography. The basic approach consists of an X-ray transparent membrane, stretched in a supporting frame, and an X-ray absorbing metal structure applied onto the membrane. Thus, silicon substrates are provided with a highly boron-doped layer, which acts as a stop layer for the membrane preparation. The wafer is then bonded to a glass plate and the silicon membrane is obtained by a selective etching technique. After deposition and patterning of the absorber, metallization is performed. One of the problems with metal films deposited on a substrate is a result of the considerable stresses in the metallized absorber layer which may cause distortion of the desired pattern.

Some improvements to remedy the above problems are described in some recent patents. Thus according to Japanese Kokai 58/73118 (cf. C.A. 100, 148511), X-ray transmitting support films for X-ray lithography photomasks are prepared by coating substrates such as silicon wafer with an organic metal complex solution and subsequently calcining the coating at a temperature of about 600° C. It is claimed that the method gives support films with very few defects. After electron-beam lithography treatment of the metal layers, the silicon wafer was removed by photoetching to give a high quality X-ray photomask.

An amorphous hydrogenated boron-nitride or boron carbon-nitride film made by plasma chemical vapor deposition is claimed to be useful for an X-ray transparent mask membrane (Japanese Kokai 63/76430 cf. C.A. 109, 139745). It is claimed that peeling of deposits on the electrodes and the susceptor was suppressed and thus contamination of the film with peeling dust could be prevented.

It has been reported (R. E. Acosta et al., Microelectronic Engineering 3, 1985 p. 573–9) that the distortion of X-ray masks is directly related to the stress of the absorber used. This distortion resulting from the material absorbed, causes a decrease in the mask characteristic property and could render the masks unusable if the stress is not minimized. In the case of films deposited on single crystal silicon substrates, the distortion can be determined with the aid of an X-ray diffraction technique. In this case it is necessary to determine the crystalline integrity of the substrate before the deposition of the film to be studied, and to ensure that no damage to the crystal occurs during the process of deposition of the film. For non-crystalline substrates, the curvature of the substrate can be determined either by mechanical or by optical means.

In a very recent patent application (German 3,634,147, cf. C.A. 107, 208862), a lithographic mask structure is described. The mask consists of a ring-like support and a masking layer support containing a luminophor to improve the sensitivity of the resistive material.

In an Abstract by T. Funayama et al. (J. Vac. Sci. Technol., Vol. 12, No. 6, Nov/Dec. 1975, 1324), there is described a new X-ray lithography mask. The mask consists of an aluminum substrate and an $Al_2O_3$ film which was grown on said aluminum substrate by anodization. The transparent aluminum membranes of alumina film were made by chemically etching away parts of the aluminum substrate.

In a review by P. A. Sullivan (I.E.E.E. Transactions on Electron Devices, Vol. ED-23, No.;, April 1976, 412-7) on Determination of Wavelength and Excitation Voltage for X-Ray Lithography, a similar X-ray mask based on aluminum is used, the aluminum oxide being grown on an aluminum substrate having a thickness of 75 microns. The disadvantage of the masks described above, is the fact that the frame which remains after the etching is actually a foil of aluminum metal which is very soft and ductile and therefore suffers from permanent distortions during its use. Moreover, during the distortion the entire membrane will be fractured.

SUMMARY OF THE INVENTION

The present invention is for making of a metallic mask by depositing a metal on a substrate, which may be a silicon wafer or copper, followed by oxidation of the metal and removal of a portion of said substrate. This leaves a metal oxide membrane supported by substrate. It is an object of the present invention to provide a simple method for obtaining a mask for X-ray lithography. It is another object of the present invention to provide a simple method for obtaining a mask for X-ray lithography which does not suffer from any distortion and maintains its high accuracy.

BRIEF DESCRIPTION OF THE DRAWING

The drawing at FIGS. 1a through 1b shows a series of steps used to create an aluminum oxide membrane which is reinforced by a silicon ring.

DESCRIPTION OF THE PREFERRED EMBODIMENTS

Figure 1A:

One method for obtaining a mask for X-ray lithography consists of the steps of:
(a) deposition of a layer of a metal amenable to oxidization on one side of a substrate, e.g., a silicon wafer, or another material such as copper, to be used as a frame. The oxidizable metal can be titanium, zirconium, tantalum, aluminum, niobium, etc. The most preferred oxidizable metal is aluminum which is light and may be converted to a compact oxide film which is transparent to X-rays by chemical treatment, oxidation or most preferably by anodizing. A thin (about 50 A) intermediate layer of a metal like chromium and/or gold or other metal may be deposited between the oxidizable metal and the substrate; the purpose of the intermediate layer is to improve adhesion and to stop the etching process of step (c);
(b) formation of a compact oxide film by complete oxidation of the metal amenable to be oxidized to a continuous thin oxide film;
(c) etching selectively a portion of the back side of the substrate, obtaining a membrane on the etched portion; and
(d) obtaining a pattern delineation on said membrane.

The pattern delineation can be made by any known method, most preferably by photoresist.

The X-ray lithography mask obtained, does not suffer from any distortion and therefore will preserve its accuracy even under stressed imposed by the steps of the mask production. The mask can be easily prepared and completes very favorably with the known methods for production thereof.

The substrate may be of any material on which etching can be performed, such as silicon, titanium, zirconium, aluminum, niobium, etc. The most convenient substrate material is silicon.

The back side of the substrate is coated by a protective coating such as photoresist or wax which after selective removal uncovers a region on which a selective etching is performed on the surface of the aluminum metal oxide without affecting the aluminum oxide surface, thus obtaining the oxide membrane with the desired area. This etching is performed by immersion in known reagent solutions, e.g., hydrofluoric acid containing oxidizing reagents such as hydrogen peroxide, or hydrazine. The latter is particularly preferred since it does not attack the aluminum metal or oxide. Any aluminum residue is finally removed by known reagent solutions such as mercuric chloride (0.1%–60% by wt.), methyl bromide or bromine dissolved in methanol, methyl iodide, ammonium halide. This removal can also be carried out by an anodic dissolution in any aqueous solution used generally for electrolytic polishing of metal, such as sodium carbonate (10–20% by wt), trisodium phosphate (2.5–7.5% by wt), sulfuric acid (10–20% by wt), phosphoric acid (40–60% by wt) or chromic acid (5–15% by wt). A person skilled in the art will select the proper solution for the selective dissolution of any metallic residues according to convenience and the availability at site.

The anodizing of the aluminum, in order to obtain the compact oxide film, may be carried out either in an anhydrous medium or in an aqueous solution at a pH in the range of 5 to 8.5. The current during the anodizing should be sufficient in order to produce a compact film having a thickness of between 0.1 to 1.5 microns. Generally, the voltage range will be between 20 to 600 V, when the anodizing is carried out in an aqueous medium; generally an ammonium borate solution (2–10% by wt.), ammonium citrate or borax is preferred. One may also conceive to carry out said anodizing by using a plasma technique.

In the last step, a pattern delineation is carried out through photoresist by electroplating or by vapor deposition of masking material which should be a heavy metal selected from gold, tungsten, titanium, tantalum, etc. According to a preferred embodiment, a thin sublayer of gold may be provided. This sublayer makes the membrane surface conductive for electroplating, when gold will be deposited. In the case of masking by a heavy metal, the role of gold sublayer, which is only optional, is to protect the oxide membrane during the subsequent etching of the masking metal. The sublayer of gold can be eliminated by choosing an appropriate selective etching technique. The gold sublayer can be obtained by vapor deposition, and will be generally in the range of 10 to 1000 Angstroms.

The mask according to the present invention, being substantially free from any stresses, will not suffer from distortion. As known, the distortion of X-ray masks is directly related to the stress of the absorber used. In the mask according to the present invention, silicon wafers, suggested by the prior art as membranes, are replaced by hard substances such as alumina or other oxide membranes and, accordingly, no distortion is encountered, while the frame is rigid enough and cannot undergo plastic deformation.

Figure 1B:
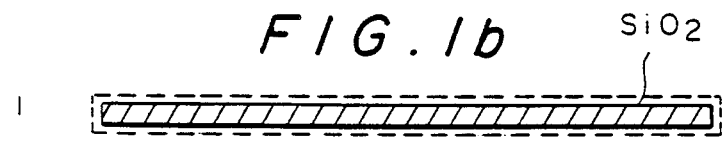
Figure 1C:
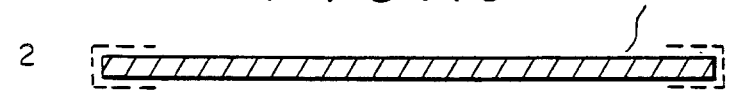
Figure 1D:
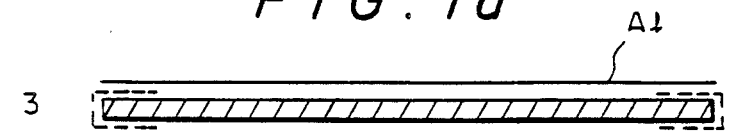
Figure 1E:
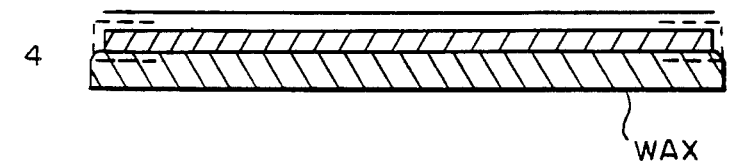
Figure 1F:
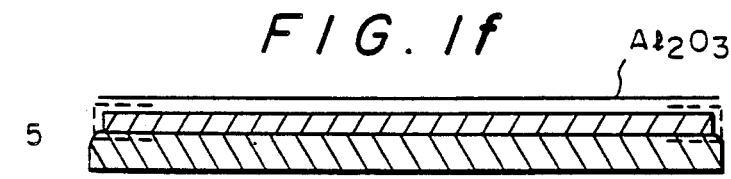
Figure 1G:
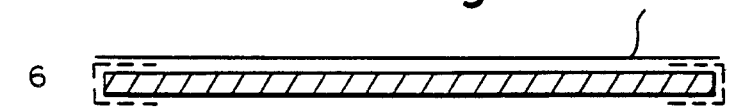
Figure 1H:

The following is another method for obtaining a mask for X-ray lithography in accordance with the invention. The process begins with a wafer of silicon which may be in the order of 0.4 mm thick and 2" in diameter. In FIG. 1, step 1 shows the complete oxidization of the surface of the silicon. In FIG. 1, step 1 is indicated by a set of dashed lines which completely surrounds the wafer. These dashed lines do not indicate another thickness, but merely those areas of the surface where silicon oxide is present.

In step 2 of FIG. 1, the silicon wafer is shown after having being etched. The etching preferably takes the form of removing the silicon oxide on both sides to form circular windows on both sides. The formation of these windows is indicated in step 2 by the removal of the surrounding dashed lines in the region of the center of the water on both sides.

In step 3, the wafer is coated with a layer of aluminum on one side thereof. The aluminum is shown in FIG. 3 as being slightly spaced from the silicon wafer which is merely for representational purposes. The aluminum, in fact, is in contact with the oxidized edge portions as well. The aluminum is shown spaced only to accommodate an indication for the oxidized surface which is the dashed line.

In step 4, there is shown the wafer when a wax material has been applied to the bottom surface. The purpose of the wax is to protect the bottom side of the silicon wafer during the step of anodizing the aluminum layer.

The aluminum layer is converted to aluminum oxide. The aluminum oxide at this state is still resting on the silicon wafer base, and the silicon must be removed in order to provide the aluminum oxide membrane. In step 6, there is shown the wafer with the wax removed in preparation for the step of removing the center portion of the silicon.

In step 7, the silicon is removed by etching with hydrazine which does not react with the aluminum oxide or silicon oxide.

The completed aluminum oxide membrane reinforced with a silicon ring is shown at step 7. The completed membrane and annular silicon support may then be cleaned of any remaining aluminum on the aluminum oxide by washing in a solution of bromine and methanol.

While the invention will now be described in connection with certain preferred embodiments in the following Examples, it will be understood that it is not intended to limit the invention to these particular embodiments. On the contrary, it is intended to cover all alternatives, modifications and equivalents as may be included within the scope of the invention as defined by the appended claims.

EXAMPLE 1

A silicon wafer, 2 inches in diameter, 0.4 mm thick, is coated by 50A of chromium and 50A of gold and 3000A of aluminum. The backside of the wafer is coated by a photoresist and the aluminum frontside is then anodically oxidized in an aqueous solution of 1% ammonium borate at a constant current density of 100 milliampere per sq. cm. for 10 sec. During this period the voltage rises to 150 volts.

The back side of the wafer is then exposed to light through a mask with a round opening, 2 cm in diameter and photographically developed, to expose the round opening. The wafer is then etched in a solution of HF, $H_2O_2$ and nitric acid at about 30° C. and rinsed in deionized water. This process produces a round compact aluminum oxide membrane, 0.5 micrometer thick, 2 cm diameter.

Pattern delineation on this membrane is attained by a conventional lithographic method of gold deposition through a photoresist. In this manner a layer of 0.5 micrometer of gold is electrodeposited on top of a 100 angstrom layer of gold produced by vapor deposition.

EXAMPLE 2

In another experiment, the compact aluminum oxide membrane is prepared as in Example 1, but the final pattern delineation is performed by vapor deposition of 0.5 micrometer of tungsten on top of a 100 angstrom layer of gold. Subsequently, a final selective dissolution is carried out by a 1:1 mixture of nitric and hydrofluoric acids through a patterned photoresist coating. The purpose of the gold is to protect the membrane during the subsequent etching of the tungsten.

EXAMPLE 3

A silicon wafer, 2 inches in diameter, 0.5 mm thick, was first coated by a layer of 0.3 microns of titanium and further coated on one side by photoresist. The resultant disc was then anodized in an aqueous solution of 0.8% $H_3PO_4$ at a constant current density of 200 milliampere per square centimeter for 6 seconds. During this period the voltage rose to 240 volts.

The back side of the disc was then exposed to light through a mask with a round opening, 2 cm in diameter and photographically processed to expose the opening area. The disc was then anodically etched in a methanol solution saturated with ammonium chloride at 10 volts for 20 minutes. This process produced a continuous titanium oxide membrane, of about 0.5 micrometer thickness resting on a silicon support. Pattern delineation on this membrane was carried out as in Example 1.

EXAMPLE 4

A silicon wafer 2" in diameter and 0.6 mm thick is oxidized over its entire surface to form a silicon oxide layer thereupon, FIG. 1, step 1. Round windows are etched into the top and bottom surfaces of said silicon oxide covered wafer in order to expose silicon in the etched regions, FIG. 1, Step 2.

A layer of 3000 Al is deposited on one side of the silicon wafer so that the Al covers the region which is covered by pure silicon as well as the perimeter region which is covered with a layer of silicon oxide, FIG. 1, step 3.

In preparation for anodizing the aluminum, the surface which does not contain aluminum is covered with wax to protect that surface, FIG. 1, Step 4.

After the aluminum is converted to aluminum oxide ($Al_2O_3$) the wax from the opposite side is removed by any suitable solvent, FIG. 1, step 5 and 6.

The thin aluminum oxide membrane is now completed by etching away the unoxidized silicon from the second side of the wafer by a solution of hydrazine, thereby exposing the second side of said aluminum oxide, FIG. 1, Step 7. The aluminum oxide membrane thus created is surrounded by a support consisting of a silicon ring which is covered with silicon oxide.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Thus for instance, one may conceive to make first the pattern delineation of a disc and subsequently etching the substrate.

I claim:

1. A method for obtaining a mask for X-ray lithography comprising the steps of:
    (a) forming a thin and a compact metallic film on the top side of a substrate having a top side and a back side, said metallic film being amenable to being oxidized to a continuous thin oxide film;
    (b) completely oxidizing said metallic film;
    (c) etching away a central portion of said substrate from the back side thereof except for a supportive frame surrounding the etched portion, thereby obtaining an oxidized metal membrane supported at its periphery by said frame; and
    (d) either before or after said etching step, obtaining a pattern delineation by photoresist on said membrane.

2. A method in accordance with claim 1, wherein said substrate is made of any etchable material.

3. A method in accordance with claim 2, wherein said substrate is made of a metal or silicon.

4. A method in accordance with claim 3, wherein said metallic film is selected from the group consisting of aluminum, titanium, zirconium, tantalum and niobium.

5. A method in accordance with claim 3, wherein said metallic film is aluminum.

6. A method in accordance with claim 1, further including the step, prior to said oxidizing step, of protecting the back side of said substrate by an inert coating.

7. A method in accordance with claim 1, wherein the etching is carried out in an aqueous or anhydrous medium.

8. A method in accordance with claim 1, wherein the pattern delineation is attained by a conventional lithographic method of gold electro-deposition on a gold sublayer produced by vapor deposition.

9. A method in accordance with claim 1, wherein the pattern delineation is attained by vapor deposition of tungsten on a gold sublayer.

10. A method in accordance with claim 8, wherein the thickness of gold sublayer is between 10 and 1000 Angstroms.

11. A method in accordance with claim 1, wherein said substrate is silicon.

12. A method in accordance with claim 11, wherein said metallic film is selected from the group consisting of aluminum, titanium, zirconium, tantalum and niobium.

13. A method in accordance with claim 10, wherein said metallic film is aluminum.

14. A method in accordance with claim 1, further including the step, prior to said forming step, of protecting a portion of the surface of the substrate and wherein said forming step comprises depositing a metal layer over a portion of the non-protected portion of said surface.

15. A method in accordance with claim 14, wherein said protecting step is carried out by oxidizing the surface of the substrate and etching away the oxidized surface at the non-protected portion.

16. A method in accordance with claim 1, further including the step of removing any remaining unoxidized metal on the oxidized metal membrane.

17. A method in accordance with claim 15, wherein said metallic film is aluminum.

18. A method in accordance with claim 17, wherein said substrate is silicon.

19. A method in accordance with claim 1, wherein said substrate is copper.

20. A method in accordance with claim 19, wherein said copper is removed with ammonia containing copper ions.

21. A method in accordance with claim 1, wherein said oxidizing step comprises anodizing.

22. A method in accordance with claim 15, wherein said oxidizing step comprises anodizing.

23. A method for obtaining a metal oxide membrane on a supportive frame, usable for obtaining a mask for X-ray lithography, comprising the steps of:
 (a) forming a thin and a compact metallic film on the top side of a substrate having a top side and a back side, said metallic film being amenable to being oxidized to a continuous thin oxide film;
 (b) completely oxidizing said metallic film; and
 (c) etching away a central portion of said substrate from the back side thereof except for a supportive frame surrounding the etched portion, thereby obtaining an oxidized metal membrane supported at its periphery by said frame.

24. A method in accordance with claim 23, further including the step, prior to said forming step, of protecting a portion of the surface of the substrate and wherein said forming step comprises depositing a metal layer over a portion of the non-protected portion of said surface.

25. A method in accordance with claim 24, wherein said protecting step is carried out by oxidizing the surface of the substrate and etching away the oxidized surface at the non-protected portion.

26. A method in accordance with claim 23, wherein said substrate is silicon.

27. A method for obtaining a mask for X-ray lithography which consists of the steps of:
 (a) oxidizing the entire surface of a silicon substrate having top and bottom sides, to form a thin silicon oxide layer on the surface;
 (b) etching a window in the top and bottom sides of said silicon oxide coated substrate;
 (c) depositing a thin metal film on one side of said silicon substrate, thereby covering portions of said side which are covered with silicon oxide, and covering the region of said side where said silicon oxide has been removed;
 (d) covering the opposite side of said substrate with a protective coating;
 (e) completely oxidizing said metal film to create a layer of oxidized metal;
 (f) removing said protective coating;
 (g) etching away silicon from the bottom side of said substrate where silicon is not covered by a layer of silicon oxide to leave a membrane of oxidized metal; and
 (h) obtaining a pattern delineation through photoresist on said membrane.

28. A method in accordance with claim 27, further including the step of removing any residues of metal remaining after said oxidizing step by means of an appropriate solvent.

29. The method in accordance with claim 27, wherein said etching is performed by a solution selected from the group consisting of mercuric chloride (0.1–60% by wt), methyl bromide or bromine in methanol, methyl iodide and ammonium halide.

30. A mask comprising a thin membrane of metal oxide supported on an annular frame of silicon with a mask pattern delineation on the surface of the metal oxide membrane opposite the side supported by the silicon frame, wherein said metal oxide membrane is formed by depositing a metal layer on a silicon substrate and totally anodizing the metal prior to etching away the silicon from areas other than the annular frame.

31. A metal oxide membrane on a supportive frame, usable in the production of masks for X-ray lithography, comprising a thin membrane of metal oxide supported on an annular frame of silicon, said metal oxide membrane being formed by depositing a metal layer on a silicon substrate and totally anodizing the metal prior to etching away the silicon from areas other than the annular frame.

* * * * *